(12) United States Patent
Wang et al.

(10) Patent No.: US 9,119,323 B2
(45) Date of Patent: Aug. 25, 2015

(54) ELECTRONIC DEVICE

(71) Applicants: Inventec (Pudong) Technology Corporation, Shanghai (CN); Inventec Corporation, Taipei (TW)

(72) Inventors: Feng-Ku Wang, Taipei (TW); Yi-Lun Cheng, Taipei (TW); Chih-Kai Yang, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 197 days.

(21) Appl. No.: 13/794,212

(22) Filed: Mar. 11, 2013

(65) Prior Publication Data

US 2014/0085819 A1 Mar. 27, 2014

(30) Foreign Application Priority Data

Sep. 27, 2012 (CN) .......................... 2012 1 0369723

(51) Int. Cl.
*H05K 7/20* (2006.01)
*G06F 1/20* (2006.01)

(52) U.S. Cl.
CPC ............ *H05K 7/20136* (2013.01); *G06F 1/203* (2013.01)

(58) Field of Classification Search
USPC .................................................. 361/692, 700
See application file for complete search history.

(56) References Cited

U.S. PATENT DOCUMENTS

2011/0097070 A1* 4/2011 Kurokawa et al. ............ 396/448
2012/0243168 A1* 9/2012 Tanaka et al. ............ 361/679.32

\* cited by examiner

*Primary Examiner* — Andargie M Aychillhum
(74) *Attorney, Agent, or Firm* — Huffman Law Group, PC

(57) ABSTRACT

An electronic device comprises a case having an air ventilation hole and an opening, a heat source, a radiator disposed inside the case and in thermal contact with the heat source, and an air current generator. The radiator comprises a body having a first and second lateral sides, and a third lateral side disposed therebetween. A first air inlet is disposed on the first lateral side. An air outlet exposed by the opening is disposed on the second lateral side, and a second air inlet is disposed on the third lateral side. The body comprising fins and a geometrical middle side of the fins is between the first and second lateral sides. The second air inlet corresponding to the air ventilation hole is between the geometrical middle side and the first lateral side. An air exhausting hole of the air current generator faces the first air inlet.

22 Claims, 12 Drawing Sheets

ELECTRONIC DEVICE

CROSS-REFERENCE TO RELATED APPLICATIONS

This non-provisional application claims priority under 35 U.S.C. §119(a) on Patent Application No(s). 201210369723.X filed in China on Sep. 27, 2012, the entire contents of which are hereby incorporated by reference.

BACKGROUND OF THE INVENTION

1. Field of the Invention

The present disclosure relates to an electronic device and more particularly to an electronic device having a radiator.

2. Description of the Related Art

In the recent years, electronic devices are usually equipped with a heat dissipation piece or a set of heat dissipation fins inside for being in thermal contact with a heat source. The heat dissipation piece or the heat dissipation fins are used for absorbing the heat of the heat source. Thereby, the heat dissipation efficiency is improved by the large heat dissipation areas of the heat dissipation piece or the heat dissipation fins.

In addition, electronic devices can be further equipped with at least one fan inside for generating an air current to blow towards the heat dissipation piece or the heat dissipation fins. Thus, the heat absorbed by the heat dissipation piece or the heat dissipation fins can be removed more quickly by the air current generated by the fan.

As users demand higher performance, the computing capabilities of electronic devices continues to increase, thus generating more heat inside the electronic devices. Only relying on the fan and the heat dissipation piece or the heat dissipation fins to dissipate heat for the heat source may be inadequate for removing the heat from inside the electronic devices. Therefore, the heat continuously accumulated inside the electronic devices will cause the temperature to increase, and may finally crash the electronic devices due to over temperature conditions.

Therefore, what is needed is a technique for enhancing the heat dissipation efficiency of the electronic devices.

SUMMARY OF THE INVENTION

An electronic device of the present disclosure is provided to enhance the heat dissipation efficiency of the electronic device.

The electronic device disclosed by the present disclosure comprises a case, a heat source, a radiator, and an air current generator. The case has an air ventilation hole and an opening. The heat source is disposed inside the case. The radiator is disposed inside the case and is in thermal contact with the heat source. The radiator comprises a body. The body has oppositely disposed first lateral side and second lateral side, and a third lateral side disposed between the first lateral side and the second lateral side. A first air inlet is disposed on the first lateral side, an air outlet is disposed on the second lateral side, and a second air inlet is disposed on the third lateral side. The opening exposes the air outlet. The body is composed of a plurality of fins, and the fins are extended from the first air inlet toward the air outlet. The fins have a geometrical middle side. The geometrical middle side is disposed between the first lateral side and the second lateral side. The second air inlet is disposed between the geometrical middle side and the first lateral side. The second air inlet corresponds to the air ventilation hole. The air current generator is disposed inside the case. An air exhausting hole of the air current generator is adhered on the first air inlet.

The electronic device disclosed by the present disclosure comprises a case, a heat source, a radiator, and an air current generator. The case has an air ventilation hole and an opening. The heat source is disposed inside the case. The radiator is disposed inside the case and in thermal contact with the heat source. The radiator comprises a body. The body has oppositely disposed first lateral side and second lateral side, and a third lateral side disposed between the first lateral side and the second lateral side. A first air inlet is disposed on the first lateral side, an air outlet is disposed on the second lateral side, and a second air inlet is disposed on the third lateral side. The opening exposes the air outlet. The body is composed of a plurality of fins, and the plurality of fins is extended from the first air inlet toward the air outlet. The plurality of fins has a geometrical middle side. The geometrical middle side is disposed between the first lateral side and the second lateral side. The second air inlet is disposed between the geometrical middle side and the first lateral side. The second air inlet corresponds to the air ventilation hole. The air current generator is disposed inside the case. An air exhausting hole of the air current generator is adhered on the first air inlet. The air current generator generates a first air current flowing from the first air inlet of the body toward the air outlet of the body. By the difference between the pressure inside the body and the pressure outside the case, the first air current sucks a second air current outside the case and causes the second air current to flow inside the body from the air ventilation hole and the second air inlet.

According to the electronic device disclosed by the present disclosure, the second air inlet is disposed on the third lateral side between the first air inlet and the air outlet. Therefore, when the first air current generated by the air current generator flows from the first air inlet toward the air outlet, the cold air outside the case can be sucked to the radiator for heat dissipation. Furthermore, because the second air inlet is disposed between the geometrical middle side of the fins and the first lateral side, the heat exchange area between the second air current formed by the cold air and the fins is relatively larger and the heat exchange time between the second air current formed by the cold air and the fins is relatively longer. As a result, the heat dissipation efficiency is enhanced.

BRIEF DESCRIPTION OF THE DRAWINGS

The present disclosure will become more fully understood from the detailed description given herein below for illustration only, and thus does not limit the present disclosure, wherein.

DETAILED DESCRIPTION

Figure 1:
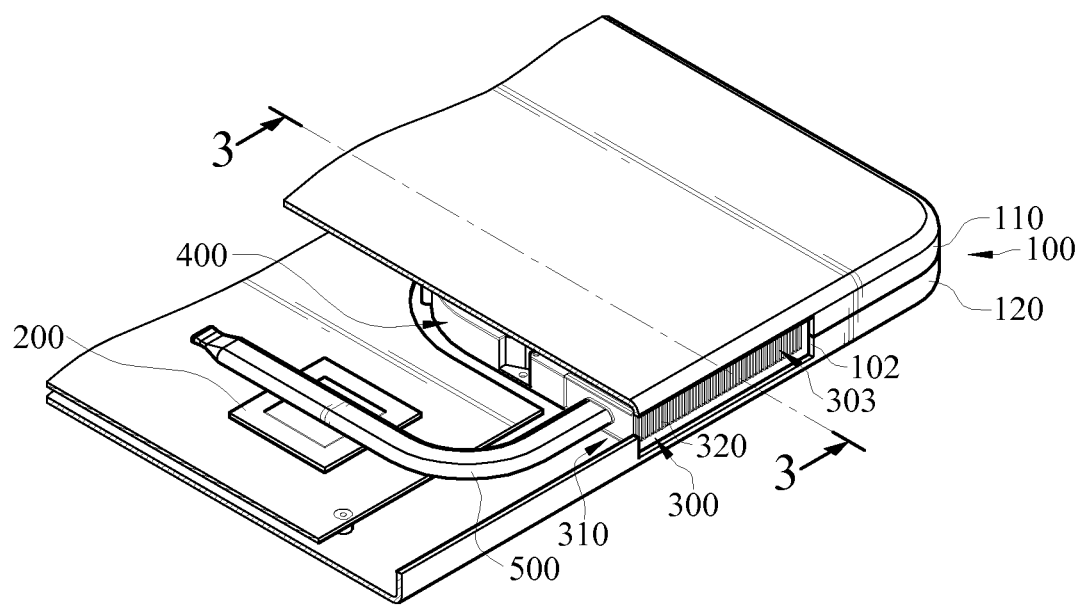
FIG. 1 is a structural perspective view of an electronic device according to an embodiment of the disclosure.
Figure 2:
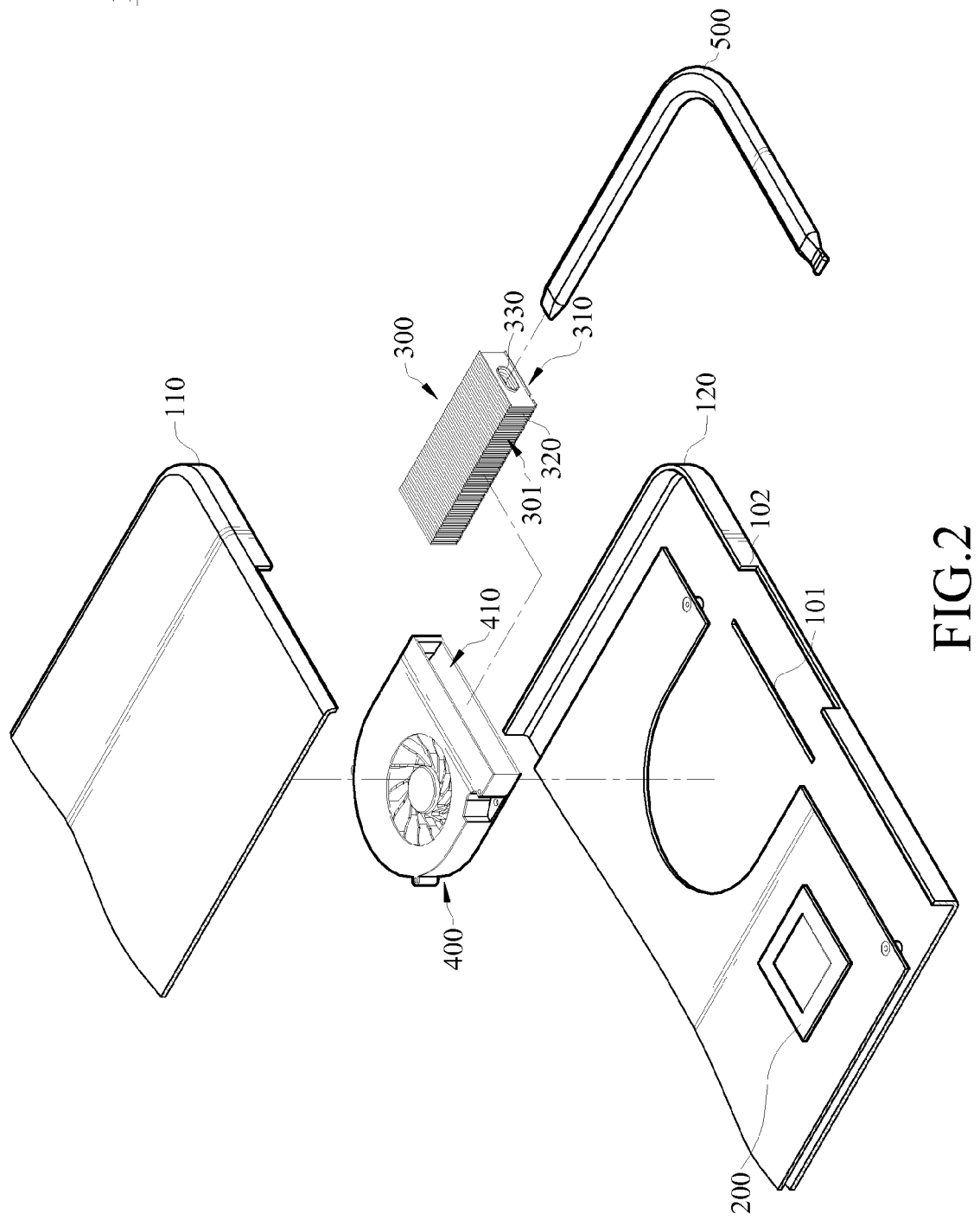
FIG. 2 is an exploded perspective view of the electronic device of FIG. 1.
Figure 3A:
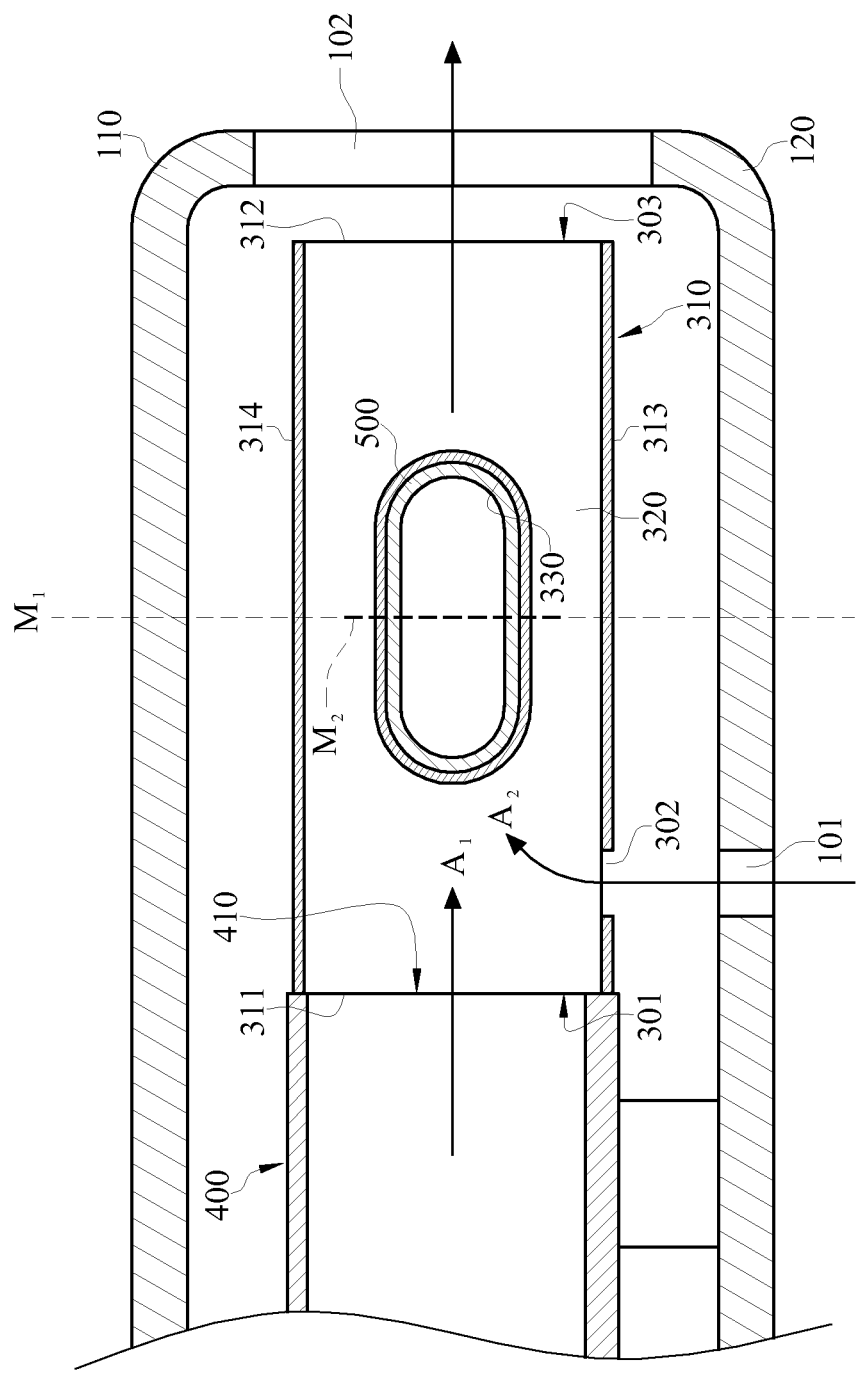
FIG. 3A is a sectional view of the electronic device of FIG. 1 along a line 3-3.

Please refer to FIGS. 1 to 3A. FIG. 1 is a structural perspective view of an electronic device 10 according to an embodiment of the disclosure. FIG. 2 is an exploded perspective view of the electronic device of FIG. 1. FIG. 3A is a sectional view of the electronic device of FIG. 1 along a line 3-3. A laptop is used for the electronic device 10 as an example, but it should not be construed as limiting the present disclosure.

The electronic device 10 of this embodiment comprises a case 100, a heat source 200, a radiator 300, and an air current generator 400.

The case 100 has an air ventilation hole 101 and an opening 102. More specifically, the case 100 comprises an upper case 110 and a lower case 120. The air ventilation hole 101 can be disposed on the lower case 120, but it should not be construed limiting present disclosure. For example, in other embodiments, the air ventilation hole 101 can be disposed on the upper case 110. The opening 102 is disposed on a lateral side of the case 100 and is formed by the upper case 110 and the lower case 120 together.

The heat source 200 is disposed inside the case 100. The heat source 200 can be, but is not limited to, a CPU (central processing unit) or a GPU (graphics processing unit).

The radiator 300 is disposed inside the case 100. More specifically, the radiator 300 is covered by the upper case 110 and the lower case 120. Furthermore, the radiator 300 is in thermal contact with the heat source 200. The electronic device 10 of this embodiment further comprises a heat conduction tube 500. Two opposite ends of the heat conduction tube 500 are in thermal contact with the heat source 200 and the radiator 300, respectively, so that the radiator 300 is in thermal contact with the heat source 200 through the heat conduction tube 500. Furthermore, in this embodiment, the radiator 300 has a slot 330. The end of the heat conduction tube 500 farther away from the heat source 200 is disposed inside the slot 330. Therefore, the heat conduction tube 500 is in thermal contact with the radiator 300.

The radiator 300 comprises a body 310. The body 310 has oppositely disposed first lateral side 311 and second lateral side 312, as well as a third lateral side 313 and a fourth lateral side 314 disposed between the first lateral side 311 and the second lateral side 312. The first lateral side 311 faces toward the inside of the electronic device 10. The second lateral side 312 faces toward the opening 102 of the case 100. The third lateral side 313 faces toward the lower case 120. The fourth lateral side 314 faces toward the upper case 110. It should be noted that, in other embodiments, the third lateral side 313 can face toward the upper case 110, and the fourth lateral side 314 can face toward the lower case 120. Furthermore, a laptop is used for the electronic device 10 of this embodiment as an example; the upper case 110 and the lower case 120 are the upper case with the keyboard and the lower case of the laptop body, respectively. But they should not be construed as limitations to the present disclosure. For example, the electronic device 10 of this embodiment can be a tablet computer; the upper case 110 and the lower case 120 are the monitor case and the bottom case of the tablet computer, respectively. Or, the electronic device 10 of this embodiment can be a mobile phone; the upper case 110 and the lower case 120 are the monitor case and the bottom case of the mobile phone respectively.

Furthermore, the third lateral side 313 of this embodiment is separated from the lower case 120 of the case 100 by a distance and is not in contact with the lower case 120 of the case 100. But such is not to be construed as a limitation to the present disclosure. For example, in other embodiments, the third lateral side 313 can be adhered directly on the lower case 120. A first air inlet 301 is disposed on the first lateral side 311, an air outlet 303 is disposed on the second lateral side 312, and a second air inlet 302 is disposed on the third lateral side 313. The opening 102 exposes the air outlet 303.

More specifically, the body 310 is composed of a plurality of fins 320, and the plurality of fins 320 is extended from the first air inlet 301 toward the air outlet 303. The plurality of fins 320 have a geometrical middle side M1 as shown in FIG. 3A. The geometrical middle side M1 is disposed between the first lateral side 311 and the second lateral side 312. The geometrical middle side M1 is the longitudinal middle side (vertical direction) of the plurality of fins 320. In other words, the geometrical middle side M1 is disposed at the middle point between the left edge and the right edge of the plurality of fins 320. Therefore, the distance between the geometrical middle side M1 and the left edge (adjacent the first lateral side 311) of the plurality of fins 320 is equal to the distance between the geometrical middle side M1 and the right edge (adjacent the second lateral side 312) of the plurality of fins 320. The second air inlet 302 is disposed between the geometrical middle side M1 and the first lateral side 311. In other words, the second air inlet 302 is adjacent to the first lateral side 311 of the body 310. Therefore, the distance between the second air inlet 302 and the first lateral side 311 is less than the distance between the second air inlet 302 and the second lateral side 312. Furthermore, the second air inlet 302 corresponds to the air ventilation hole 101. In this embodiment, the air ventilation hole 101 is right below the second air inlet 302.

Additionally, the heat conduction tube 500 has a cross-sectional middle line M2 as shown in FIG. 3A. The cross-sectional middle line M2 is the longitudinal middle line of the sectional area of the heat conduction tube 500 formed by sectioning along the radial direction. The distance between the cross-sectional middle line M2 and the left edge of the sectional area of the heat conduction tube 500 is equal to the distance between the cross-sectional middle line M2 and the right edge of the sectional area of the heat conduction tube 500. The cross-sectional middle line M2 is overlapped with the geometrical middle side M1 of the plurality of fins 320. In other words, the heat conduction tube 500 is disposed at the geometrical middle point of the plurality of fins 320. Thereby, the heat of the heat conduction tube 500 can be transferred and distributed to the plurality of fins 320 more evenly.

Figure 3B:
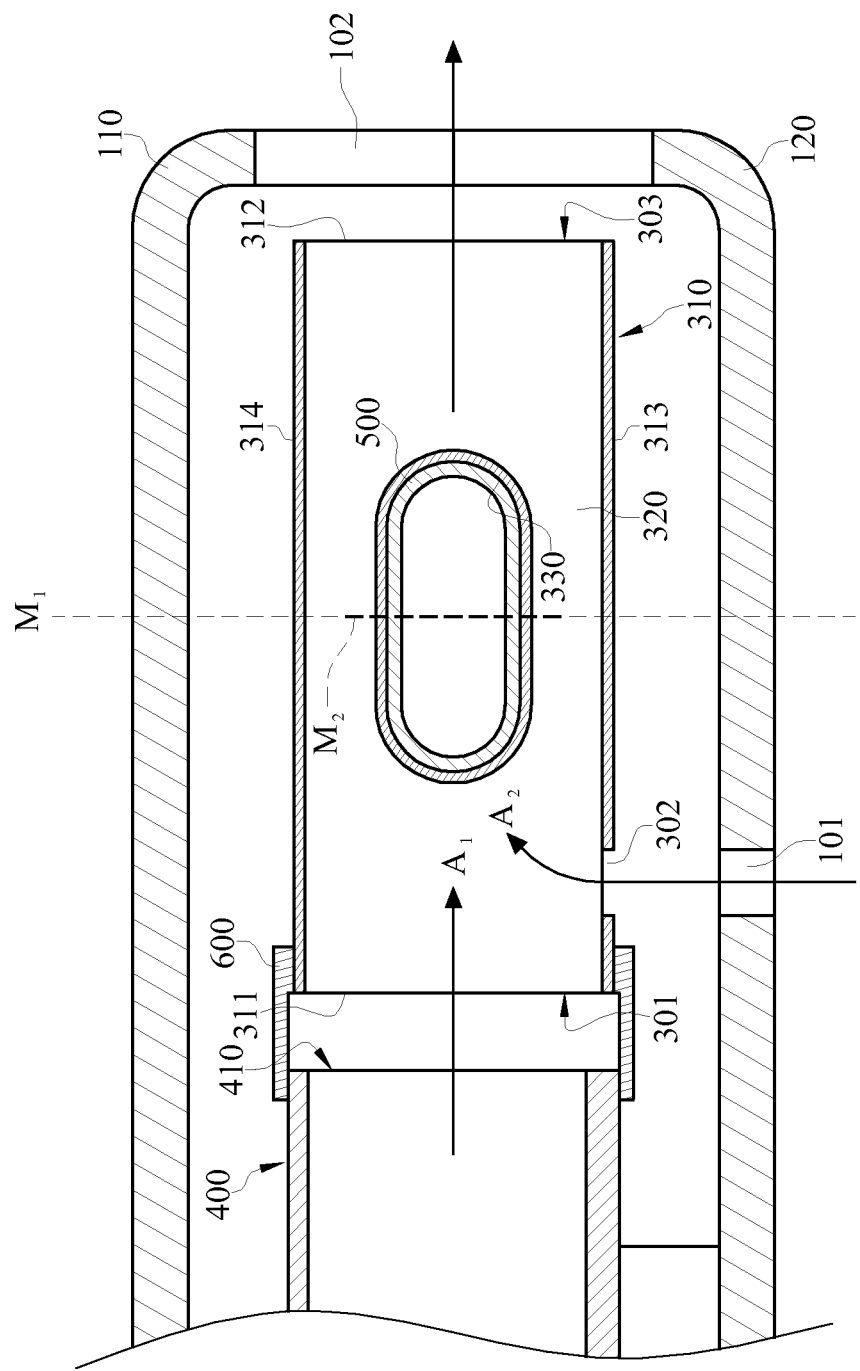
FIG. 3B is a sectional view of the electronic device according to another embodiment of the disclosure.

The air current generator 400 is disposed inside the case 100. The air current generator 400 can be, but not limited to be an axial fan, a centrifugal fan or a turbulent, pulsated air-jet such as a SYNJET®. An air exhausting hole 410 of the air current generator 400 is adhered on the first air inlet 301. There is no side gap between the air exhausting hole 410 and the first air inlet 301 in order to prevent from drawing in an unexpected air current to reduce the heat dissipation efficiency. More specifically, by adhering the air exhausting hole 410 of the air current generator 400 on the first lateral side 311 of the body 310 directly, there will be no side gap between the air exhausting hole 410 and the first air inlet 301. Alternatively, the radiator 300 further comprises a covering element 600 as shown in FIG. 3B. By sleeving the two opposite ends of the covering element 600, respectively, at the end of the body 310 adjacent the first lateral side 311 and the end of the air current generator 400 adjacent the air exhausting hole 410, the side gap between the air exhausting hole 410 and the first air inlet 301 is sealed off.

When the air current generator 400 operates to generate a first air current A1, the first air current A1 enters into the body 310 of the radiator 300 from the first air inlet 301. After the first air current A1 exchanges heat with the fins 320 inside the body 310, the first air current A1 is then exhausted from the air outlet 303. Because the air current generator 400 is disposed inside the case 100 of the electronic device 10, the temperature of the first air current A1 generated by the air current generator 400 is usually higher (due to the waste heat inside the case 100), and the heat dissipation effect is relatively limited. Therefore in this embodiment, the second air inlet 302 is disposed on the third lateral side 313 of the body 310 of the radiator 300, and the air ventilation hole 101 is disposed on the lower case 120 in order to enhance the heat dissipation effect.

More specifically, the Bernoulli Principle states that as the velocity of a fluid increases, the pressure exerted by that fluid decreases. Therefore, when the first air current A1 generated by the air current generator 400 flows from the first air inlet 301 to the air outlet 303, the pressure inside the body 310 of the radiator 300 is less than the pressure outside. As a result, the cold air outside the case 100 can be sucked into the radiator 300 to generate a second air current A2. The second air current A2 flows through the air ventilation hole 101 and the second air inlet 302 to the body 310 of the radiator 300. Thereby, besides the first air current A1 generated by the air current generator 400, the second air current A2 formed by the cold air outside the case 100 is also drawn into the body 310 of the radiator 300 at the same time to exchange heat with the fins 320.

Furthermore, because the second air inlet 302 is disposed between the geometrical middle side M1 and the first lateral side 311, the second air current A2 formed by the cold air has a longer flowing path inside the body 310 of the radiator 300. Thereby, the heat exchange area between the second air current A2 formed by the cold air and the fins 320 is relatively larger and the heat exchange time between the second air current A2 formed by the cold air and the fins 320 is relatively longer. As a result, the heat dissipation efficiency is enhanced.

Figure 4:
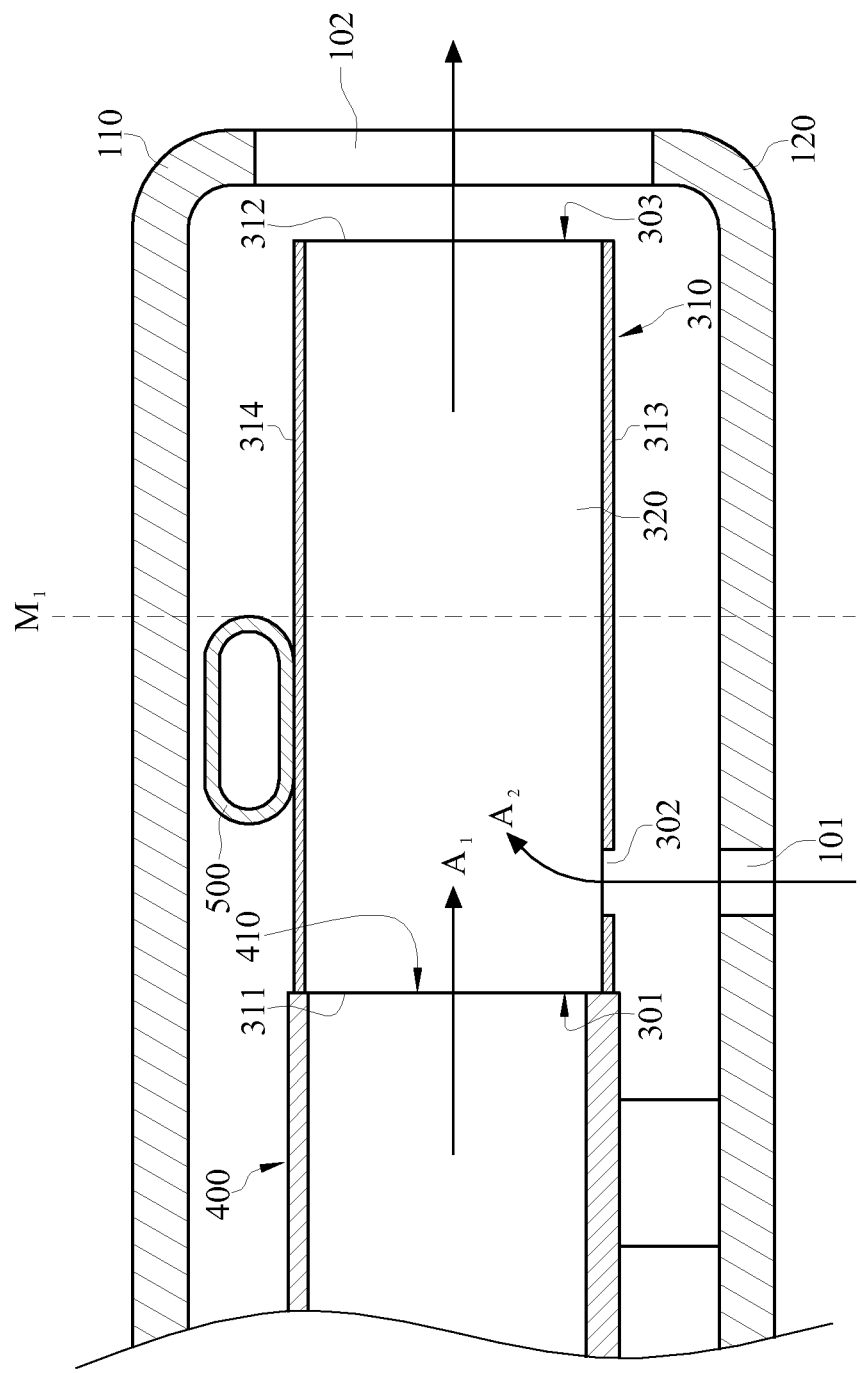
FIG. 4 is a sectional view of the electronic device according to another embodiment of the disclosure.

Please refer to FIG. 4. FIG. 4 is a sectional view of the electronic device according to another embodiment of the disclosure. This embodiment is similar to the embodiment of FIG. 3A. Similar elements are represented by the same numbers.

The difference between this embodiment and the embodiment of FIG. 3A is that the heat conduction tube 500 of this embodiment is directly adhered on the surface of the body 310 of the radiator 300 to achieve the thermal contact effect. More specifically, the heat conduction tube 500 is directly adhered on the fourth lateral side 314 of the body 310. But it should not be construed a limitation to the present disclosure. For example, in other embodiments, the heat conduction tube 500 can be directly adhered on the third lateral side 313 of the body 310.

Figure 5A:
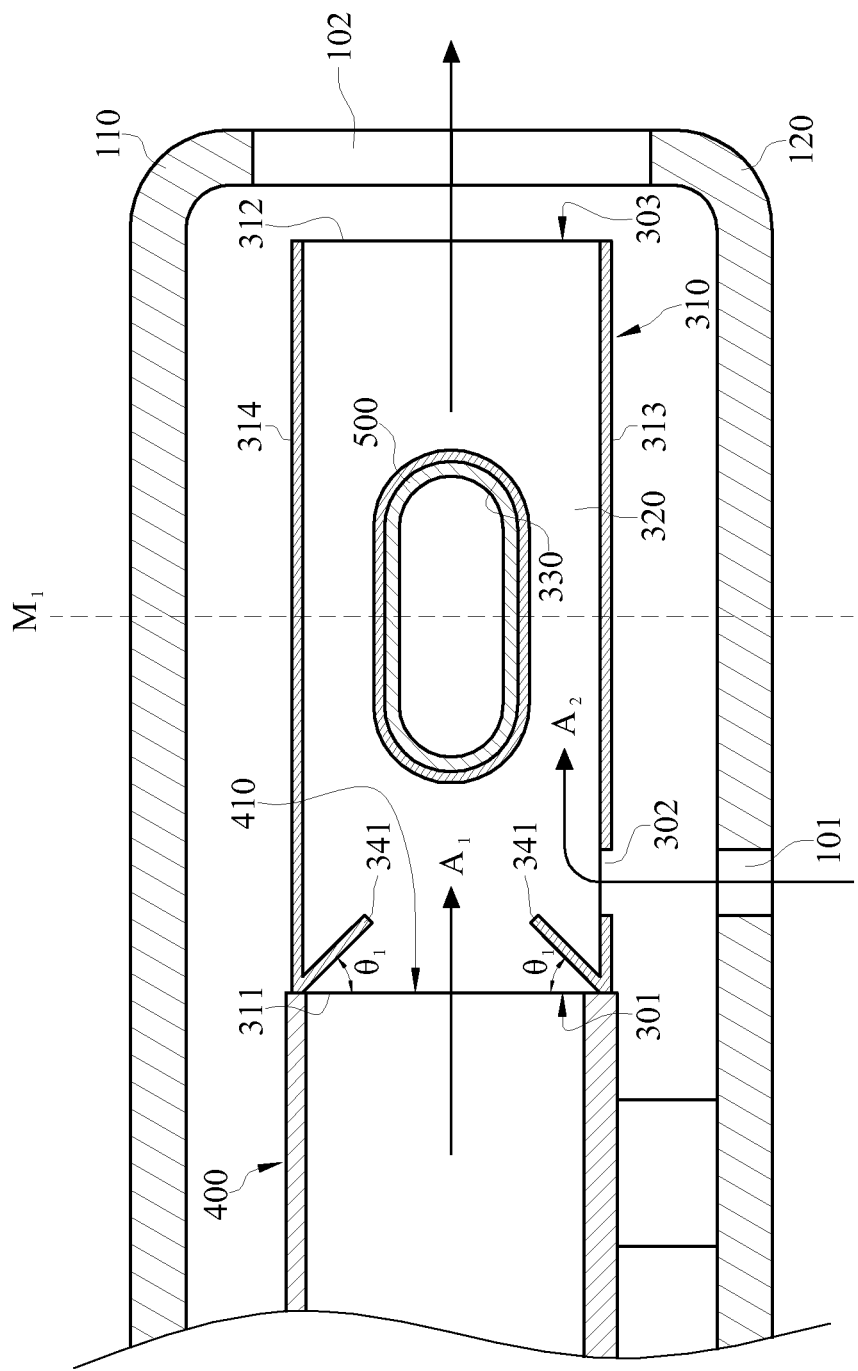
FIG. 5A is a sectional view of the electronic device according to another embodiment of the disclosure.

Please refer to FIG. 5A. FIG. 5A is a sectional view of the electronic device according to another embodiment of the disclosure. This embodiment is similar to the embodiment of FIG. 3A. Similar elements are represented by the same numbers.

The difference between this embodiment and the embodiment of FIG. 3A is that two first deflectors 341 are disposed inside the body 310 of the radiator 300 of this embodiment. An acute angle $\theta 1$ is formed between each of the first deflectors 341 and the first lateral side 311. Each of the first deflectors 341 is adjacent to the first air inlet 301. Furthermore, the distance between the two first deflectors 341 gradually lessens towards the direction further away from the first air inlet 301. When the first air current A1 flows between the two first deflectors 341, because the cross-sectional area of the first air current A1 is compressed by the two first deflectors 341 and becomes smaller, the velocity of the first air current A1 increases. Thus, the difference between the pressure inside the body 310 of the radiator 300 and the pressure outside will increase in order to enhance the effect of drawing the second air current A2 formed by the cold air outside into the body 310. As a result, the heat dissipation efficiency is enhanced.

It should be noted that, the quantity of the first deflectors 341 in this embodiment is two. But it should not be construed as a limitation to the present disclosure. For example, in other embodiments, the quantity of the first deflectors 341 can be one.

Figure 5B:
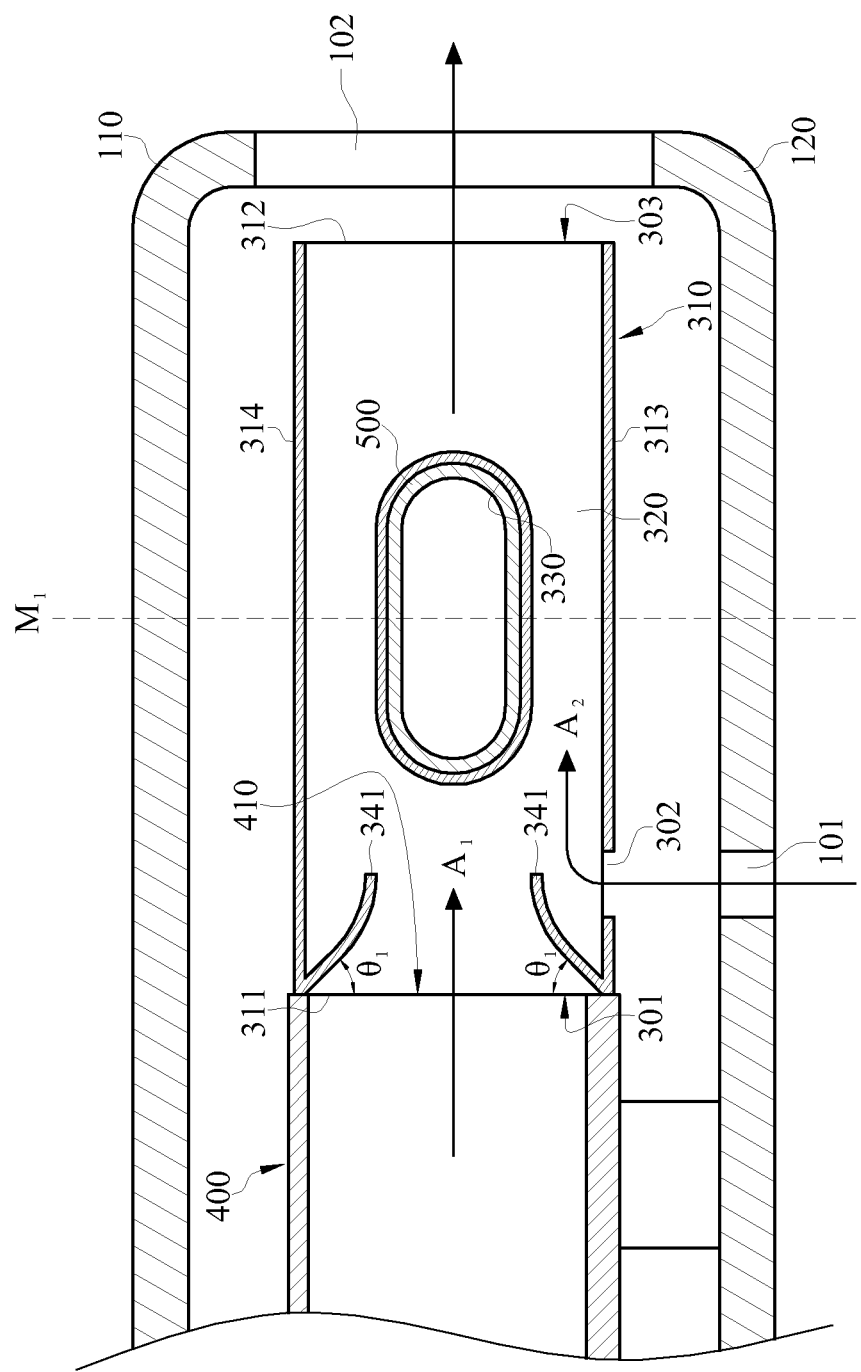
FIG. 5B is a sectional view of the electronic device according to another embodiment of the disclosure.
Figure 5C:
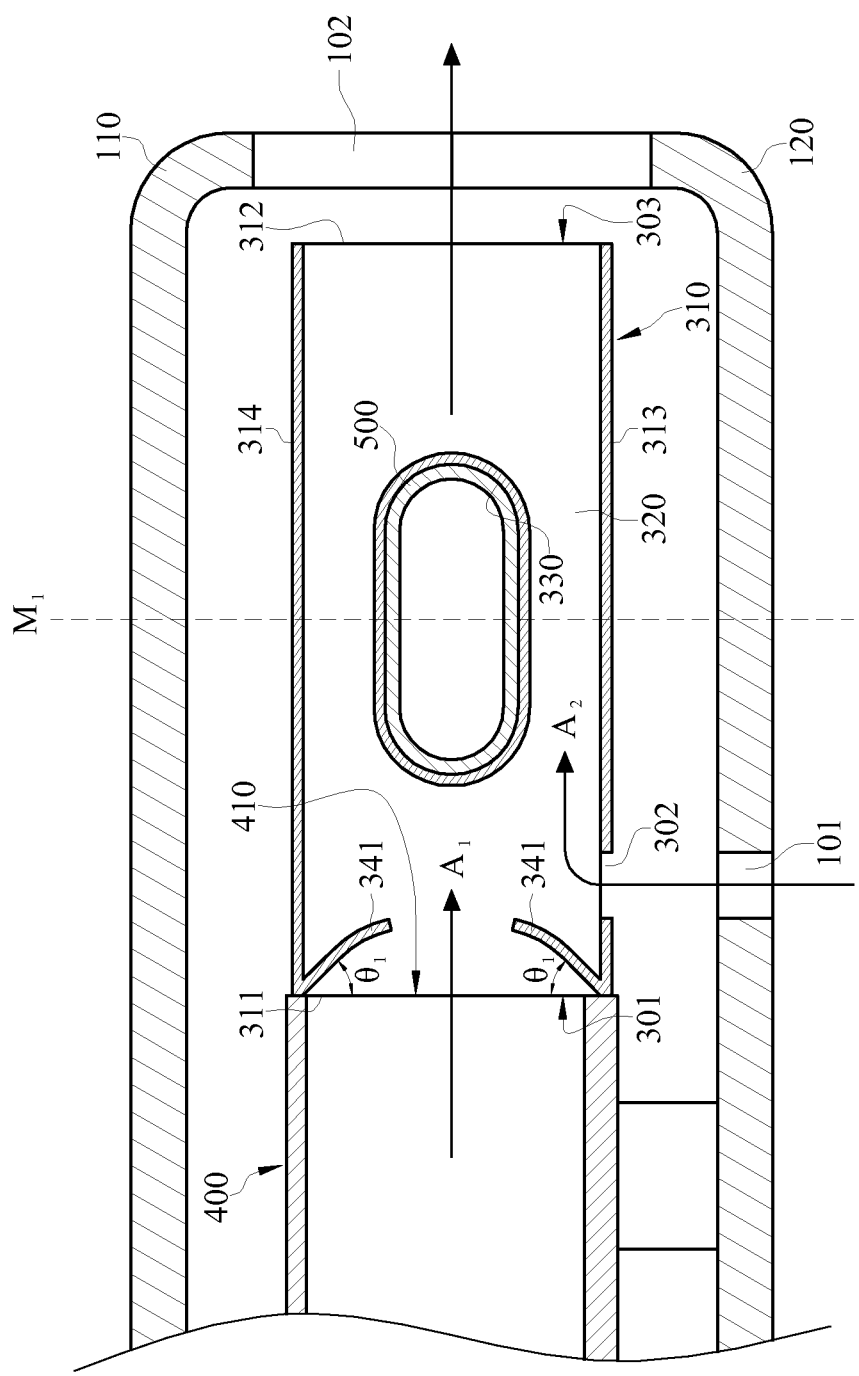
FIG. 5C is a sectional view of the electronic device according to another embodiment of the disclosure.

Furthermore, in this embodiment, the first deflectors 341 are flat plates. But the shape of the first deflectors 341 should not be construed as a limitation to the present disclosure. For example, in other embodiments, the shape of the first deflectors 341 can be a convex plate as shown in FIG. 5B. Or, the shape of the first deflectors 341 can be a concave plate as shown in FIG. 5C.

Figure 6:
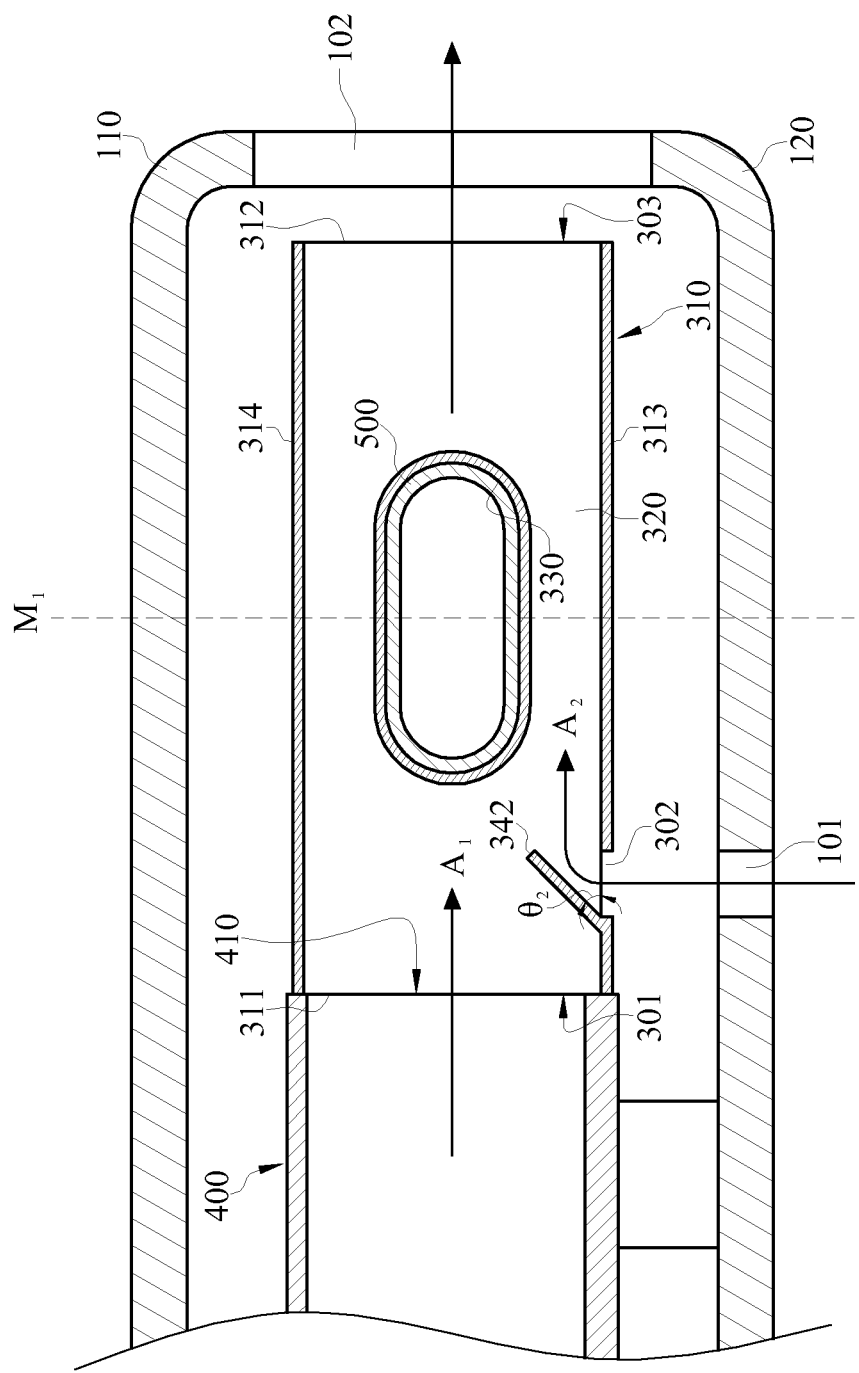
FIG. 6 is a sectional view of the electronic device according to another embodiment of the disclosure.

Please refer to FIG. 6. FIG. 6 is a sectional view of the electronic device according to another embodiment of the disclosure. This embodiment is similar to the embodiment of FIG. 3A. Similar elements are represented by the same numbers.

The difference between this embodiment and the embodiment of FIG. 3A is that a second deflector 342 is disposed inside the body 310 of the radiator 300. An acute angle $\theta 2$ is formed between the second deflector 342 and the third lateral side 313. The second deflector 342 is adjacent to the second air inlet 302, and an end of the second deflector 342 adjacent the air outlet 303 is further away from the third lateral side 313. The second deflector 342 is used for guiding the second air current A2 to flow smoothly toward the air outlet 303 in order to prevent turbulences from generating between the second air current A2 and the first air current A1.

Figure 7:
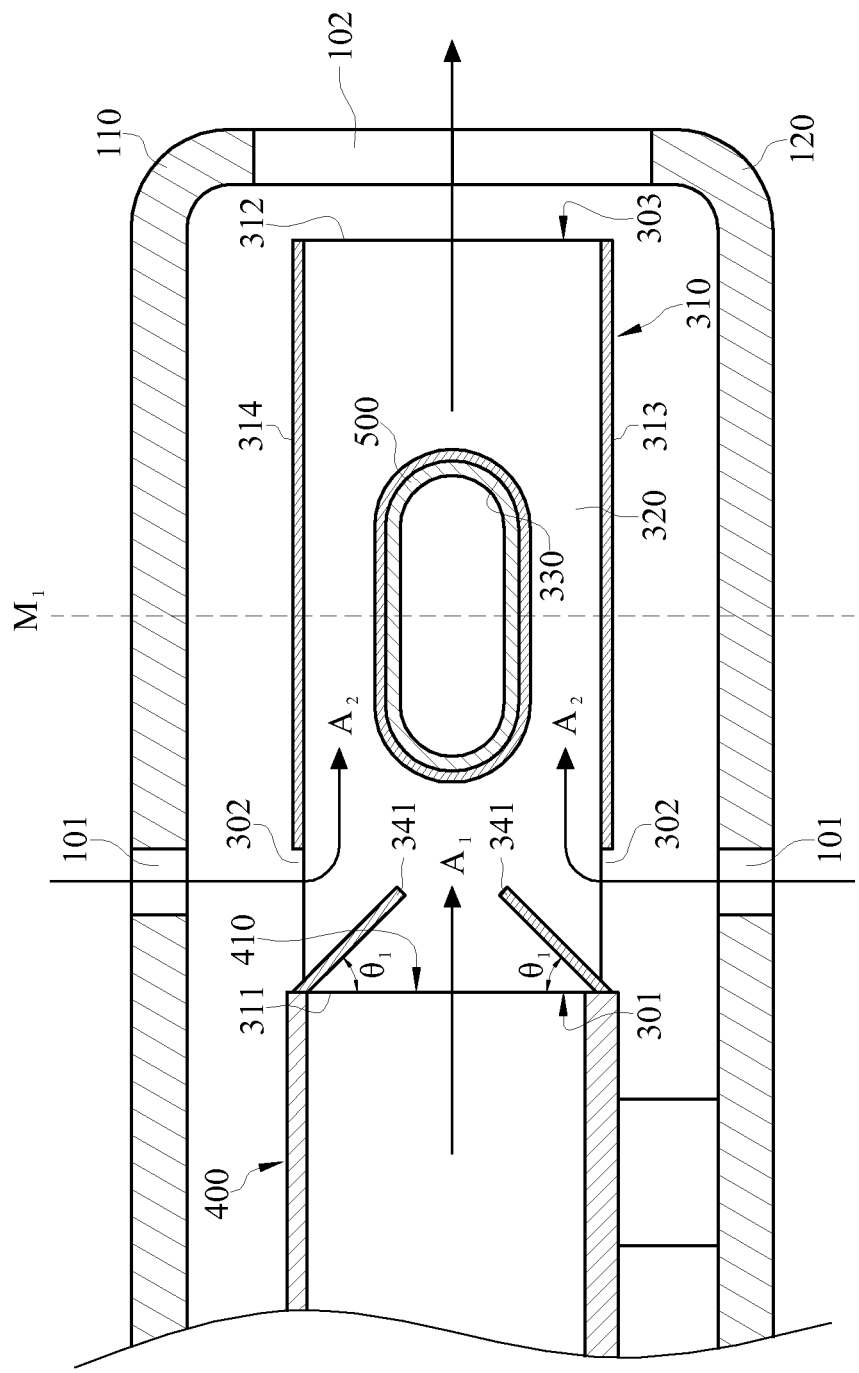
FIG. 7 is a sectional view of the electronic device according to another embodiment of the disclosure.

Please refer to FIG. 7. FIG. 7 is a sectional view of the electronic device according to another embodiment of the disclosure. This embodiment is similar to the embodiment of FIG. 3A. Similar elements are represented by the same numbers.

The difference between this embodiment and the embodiment of FIG. 3A is that the quantity of the second air inlet 302 of this embodiment is two. The two second air inlets 302 are respectively disposed on the third lateral side 313 and the fourth lateral side 314. The quantity of the air ventilation hole 101 of this embodiment is two. The two air ventilation holes 101 are respectively disposed on the lower case 120 and the upper case 110. The two first deflectors 341 are disposed inside the body 310 of the radiator 300 of this embodiment. An acute angle $\theta 1$ is formed between each of the first deflectors 341 and the first lateral side 311. Two opposite sides of each of the first deflectors 341 are respectively adjacent to the first air inlet 301 and the second air inlet 302. Furthermore, the distance between the two first deflectors 341 is gradually becoming shorter towards the direction further away from the first air inlet 301. Beside that the first deflectors 341 of this embodiment can enhance the velocity of the first air current A1, the first deflectors 341 can also guide the second air current A2 to flow smoothly toward the air outlet 303.

Figure 8:
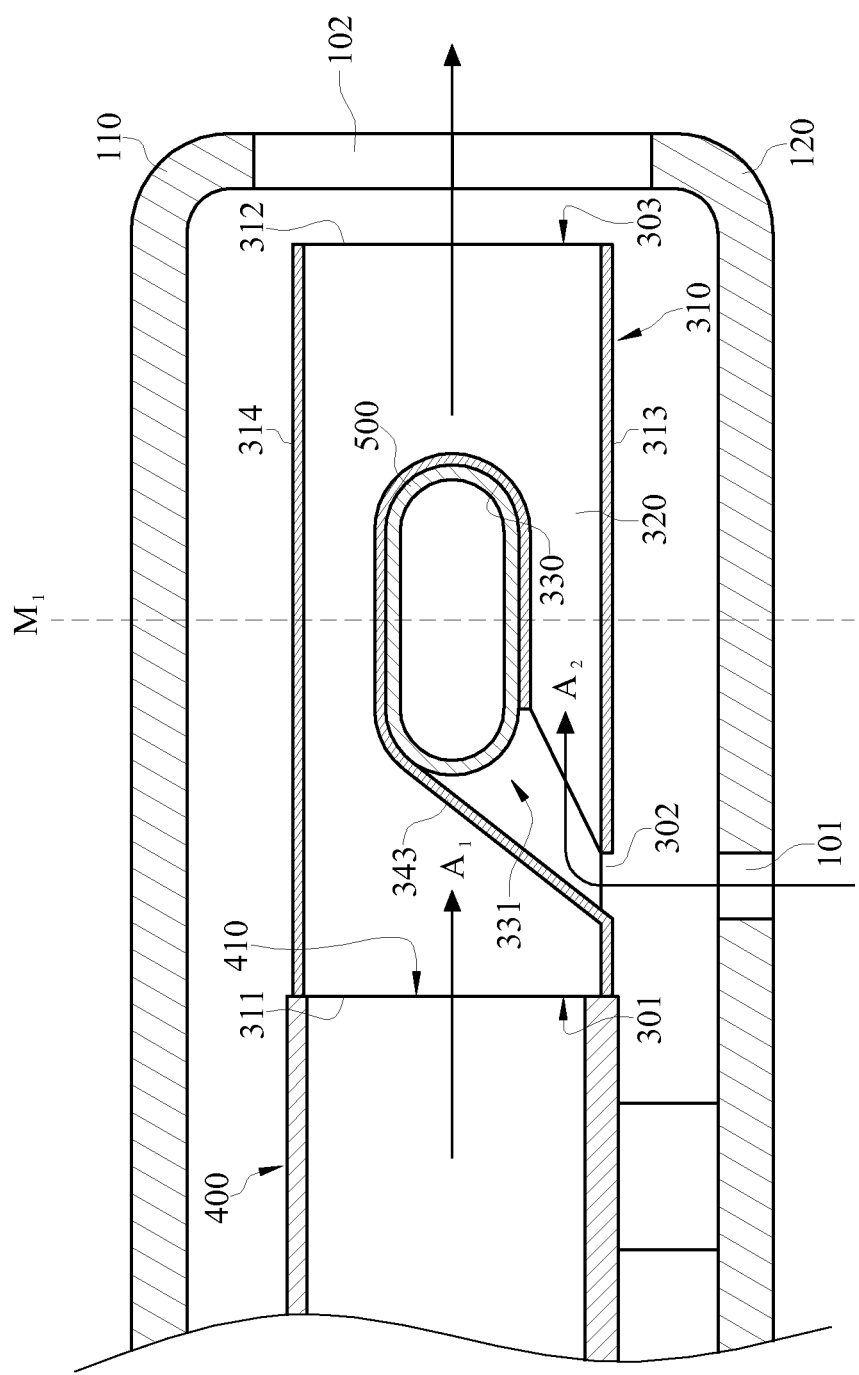
FIG. 8 is a sectional view of the electronic device according to another embodiment of the disclosure.

Please refer to FIG. 8. FIG. 8 is a sectional view of the electronic device according to another embodiment of the disclosure. This embodiment is similar to the embodiment of FIG. 3A. Similar elements are represented by the same numbers.

The difference between this embodiment and the embodiment of FIG. 3A is that the slot 330 of the radiator 300 of this embodiment has a gap 331. The gap 331 is disposed inside the body 310. The gap 331 faces toward the second air inlet 302. Furthermore, a third deflector 343 is disposed at the gap 331. The third deflector 343 is extended from the gap 331 to the second air inlet 302. Thus, when the second air current A2 is guided by the third deflector 343 to flow through the gap 331 from the second air inlet 302, the second air current A2 can contact and exchange heat with the heat conduction tube 500 directly in order to remove the heat from heat conduction tube 500. As a result, the heat dissipation efficiency is enhanced.

Figure 9:
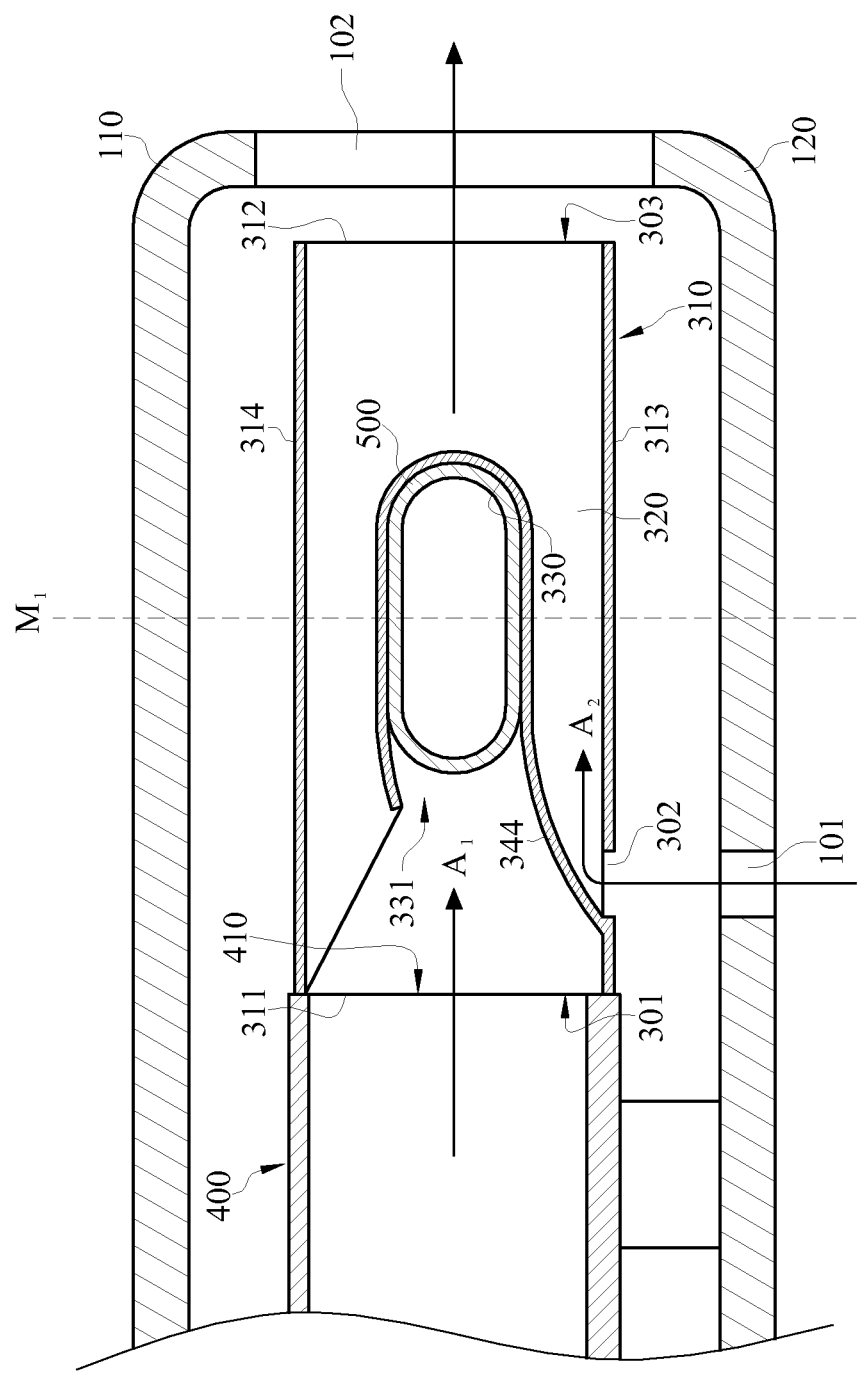
FIG. 9 is a sectional view of the electronic device according to another embodiment of the disclosure.

Please refer to FIG. 9. FIG. 9 is a sectional view of the electronic device according to another embodiment of the disclosure. This embodiment is similar to the embodiment of FIG. 3A. Similar elements are represented by the same numbers.

The difference between this embodiment and the embodiment of FIG. 3A is that the slot 330 of the radiator 300 of this embodiment has the gap 331. The gap 331 is disposed inside the body 310. The gap 331 faces toward the first air inlet 301. Furthermore, a fourth deflector 344 is disposed at the gap 331. The fourth deflector 344 is extended from the gap 331 to the first air inlet 301. Thereby, when the first air current A1 is guided by the fourth deflector 344 to flow through the gap 331 from the first air inlet 301, the first air current A1 can contact and exchange heat with the heat conduction tube 500 directly in order to remove the heat from heat conduction tube 500. As a result, the heat dissipation efficiency is enhanced.

According to the electronic device of the above embodiments, the second air inlet is disposed on the third lateral side between the first air inlet and the air outlet. Therefore, when the first air current generated by the air current generator flows from the first air inlet toward the air outlet, the cold air outside the case can be sucked to the radiator for heat dissipation. Furthermore, because the second air inlet is disposed between the geometrical middle side of the plurality of fins and the first lateral side, the heat exchange area between the second air current formed by the cold air and the plurality of fins is relatively larger and the heat exchange time between the second air current formed by the cold air and the plurality of fins is relatively longer. As a result, the heat dissipation efficiency is enhanced.

Note that the specifications relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:

1. An electronic device, comprising:
    a case having an air ventilation hole and an opening;
    a heat source disposed inside the case;
    a radiator disposed inside the case and in thermal contact with the heat source, the radiator comprising a body, the body having oppositely disposed first lateral side and second lateral side, and a third lateral side disposed between the first lateral side and the second lateral side, a first air inlet being disposed on the first lateral side, an air outlet being disposed on the second lateral side, a second air inlet being disposed on the third lateral side, the opening exposing the air outlet, the body being composed of a plurality of fins, and the plurality of fins being extended from the first air inlet toward the air outlet, the plurality of fins having a geometrical middle side, the geometrical middle side being disposed between the first lateral side and the second lateral side, the second air inlet being disposed between the geometrical middle side and the first lateral side, the second air inlet corresponding to the air ventilation hole; and
    an air current generator disposed inside the case, an air exhausting hole of the air current generator being adhered on the first air inlet.

2. The electronic device as claimed in claim 1, further comprising a heat conduction tube, two opposite ends of the heat conduction tube being in thermal contact with the heat source and the radiator, respectively.

3. The electronic device as claimed in claim 2, wherein the heat conduction tube is adhered on a surface or the third lateral side of the body of the radiator.

4. The electronic device as claimed in claim 2, wherein the radiator has a slot, and the heat conduction tube is disposed inside the slot.

5. The electronic device as claimed in claim 4, wherein the slot further comprises a gap, the gap is disposed inside the body, and the gap faces toward the first air inlet.

6. The electronic device as claimed in claim 4, wherein the slot further comprises a gap, the gap is disposed inside the body, and the gap faces toward the second air inlet.

7. The electronic device as claimed in claim 2, wherein a cross-sectional middle line of the heat conduction tube is overlapped with the geometrical middle side of the plurality of fins.

8. The electronic device as claimed in claim 1, wherein the third lateral side is separated from the case by a distance.

9. The electronic device as claimed in claim 1, wherein a first deflector is further disposed inside the body, an acute angle is formed between the first deflector and the first lateral side, and the first deflector is adjacent to the first air inlet.

10. The electronic device as claimed in claim 1, wherein a second deflector is further disposed inside the body, an acute angle is formed between the second deflector and the third lateral side, the second deflector is adjacent to the second air inlet, and an end of the second deflector adjacent the air outlet is further away from the third lateral side.

11. The electronic device as claimed in claim 1, wherein the radiator further comprises a covering element, and two opposite ends of the covering element are respectively sleeved at an end of the body adjacent the first lateral side and an end of the air current generator adjacent the air exhausting hole.

12. An electronic device, comprising:
    a case having an air ventilation hole and an opening;
    a heat source disposed inside the case;
    a radiator disposed inside the case and in thermal contact with the heat source, the radiator comprising a body, the body having oppositely disposed first lateral side and second lateral side, and a third lateral side disposed between the first lateral side and the second lateral side, a first air inlet being disposed on the first lateral side, an air outlet being disposed on the second lateral side, a second air inlet being disposed on the third lateral side, the opening exposing the air outlet, the body being composed of a plurality of fins, and the plurality of fins being extended from the first air inlet toward the air outlet, the plurality of fins having a geometrical middle side, the geometrical middle side being disposed between the first lateral side and the second lateral side, the second air inlet being disposed between the geometrical middle side and the first lateral side, and the second air inlet corresponding to the air ventilation hole; and an air current generator disposed inside the case, an air exhausting hole of the air current generator being adhered on the first air inlet, the air current generator generating a first air current flowing from the first air inlet of the body toward the air outlet of the body, by the difference between the pressure inside the body and the pressure outside the case, and the first air current sucking a second air current outside the case and causing the second air current to flow inside the body from the air ventilation hole and the second air inlet.

13. The electronic device as claimed in claim 12, further comprising a heat conduction tube, and two opposite ends of the heat conduction tube being in thermal contact with the heat source and the radiator, respectively.

14. The electronic device as claimed in claim 13, wherein the heat conduction tube is adhered on a surface or the third lateral side of the body of the radiator.

15. The electronic device as claimed in claim 13, wherein the radiator has a slot, and the heat conduction tube is disposed inside the slot.

16. The electronic device as claimed in claim 15, wherein the slot further comprises a gap, the gap is disposed inside the body, and the gap faces toward the first air inlet.

17. The electronic device as claimed in claim 15, wherein the slot further comprises a gap, the gap is disposed inside the body, and the gap faces toward the second air inlet.

18. The electronic device as claimed in claim 13, wherein a cross-sectional middle line of the heat conduction tube is overlapped with the geometrical middle side of the plurality of fins.

19. The electronic device as claimed in claim 12, wherein the third lateral side is separated from the case by a distance.

20. The electronic device as claimed in claim 12, wherein a first deflector is further disposed inside the body, an acute angle is formed between the first deflector and the first lateral side, and the first deflector is adjacent to the first air inlet.

21. The electronic device as claimed in claim 12, wherein a second deflector is further disposed inside the body, an acute angle is formed between the second deflector and the third lateral side, the second deflector is adjacent to the second air inlet, and an end of the second deflector adjacent the air outlet is further away from the third lateral side.

22. The electronic device as claimed in claim 12, wherein the radiator further comprises a covering element, and two opposite ends of the covering element are respectively sleeved at an end of the body adjacent the first lateral side and an end of the air current generator adjacent the air exhausting hole.

* * * * *